US011639788B2

(12) United States Patent
Diana et al.

(10) Patent No.: US 11,639,788 B2
(45) Date of Patent: May 2, 2023

(54) FLEXIBLE LEDS STRIPS WITH STAGGERED INTERCONNECTS

(71) Applicant: Lumileds LLC, San Jose, CA (US)

(72) Inventors: Frederic Stephane Diana, Santa Clara, CA (US); Shu Fan Yew, Bayan Lepas (MY)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 17/872,335

(22) Filed: Jul. 25, 2022

(65) Prior Publication Data

US 2022/0357025 A1  Nov. 10, 2022

Related U.S. Application Data

(63) Continuation of application No. 17/125,878, filed on Dec. 17, 2020, now Pat. No. 11,428,393.

(60) Provisional application No. 62/951,904, filed on Dec. 20, 2019.

(51) Int. Cl.
| | |
|---|---|
| *F21V 23/00* | (2015.01) |
| *F21S 4/24* | (2016.01) |
| *F21Y 103/10* | (2016.01) |
| *F21Y 115/10* | (2016.01) |

(52) U.S. Cl.
CPC .............. *F21V 23/005* (2013.01); *F21S 4/24* (2016.01); *F21V 23/002* (2013.01); *F21Y 2103/10* (2016.08); *F21Y 2115/10* (2016.08)

(58) Field of Classification Search
CPC ........ F21V 23/005; F21V 23/003; F21S 4/20; F21S 4/22; F21S 4/24
See application file for complete search history.

(56) References Cited

U.S. PATENT DOCUMENTS

| | | | | |
|---|---|---|---|---|
| 4,173,035 | A * | 10/1979 | Hoyt ...................... | H05B 45/30 40/594 |
| 8,851,356 | B1 | 10/2014 | Holec et al. | |
| 9,239,136 | B1 * | 1/2016 | Petersen ................. | F21V 23/06 |
| 2005/0162850 | A1 | 7/2005 | Luk et al. | |
| 2008/0062688 | A1 * | 3/2008 | Aeling ..................... | F21K 9/68 362/296.07 |
| 2012/0195024 | A1 * | 8/2012 | Kawaguchi ............ | H05K 3/363 361/803 |
| 2021/0190303 | A1 | 6/2021 | Diana et al. | |

OTHER PUBLICATIONS

"U.S. Appl. No. 17/125,878, Examiner Interview Summary dated Apr. 20, 2022", 2 pgs.
"U.S. Appl. No. 17/125,878, Non Final Office Action dated Jan. 19, 2022", 12 pgs.

(Continued)

*Primary Examiner* — Andrew J Coughlin
*Assistant Examiner* — Nathaniel J Lee
(74) *Attorney, Agent, or Firm* — Schwegman, Lundberg & Woessner, P.A.

(57) ABSTRACT

A flexible light emitting diode (LED) circuit having a first layer, the first layer including a conductive material configured to connect to an LED die, a second layer, the second layer including an electrically insulating material, and a third layer positioned between the first and second layer, the third layer having a first terminal extended electrically connecting tab that extends outward beyond the first layer and the second layer.

20 Claims, 12 Drawing Sheets

(56) References Cited

OTHER PUBLICATIONS

"U.S. Appl. No. 17/125,878, Notice of Allowance dated May 4, 2022", 10 pgs.
"U.S. Appl. No. 17/125,878, Response filed Apr. 18, 2022 to Non Final Office Action dated Jan. 19, 2022", 7 pgs.

* cited by examiner

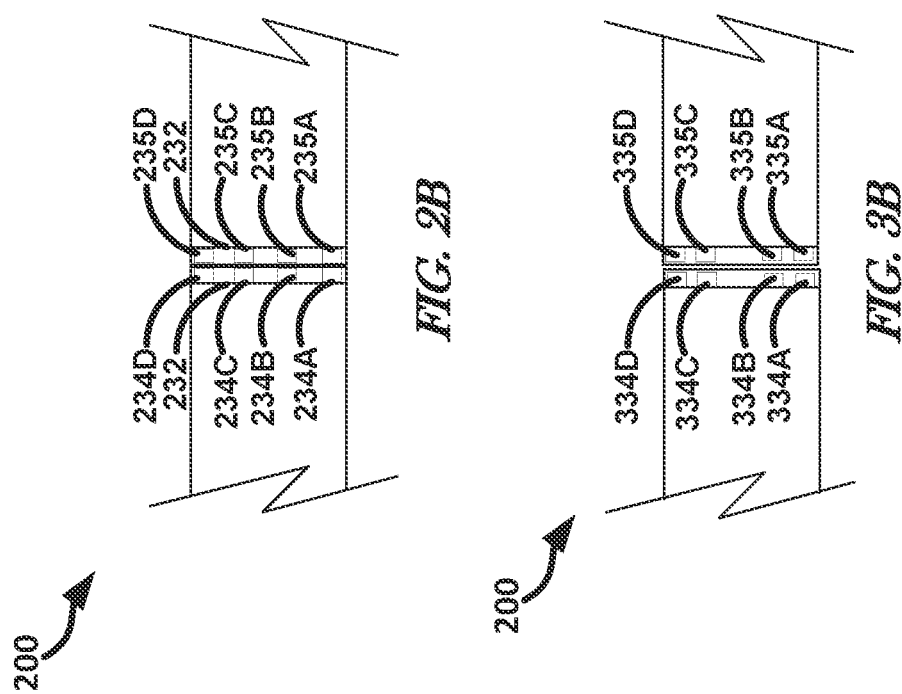

FLEXIBLE LEDS STRIPS WITH STAGGERED INTERCONNECTS

PRIORITY CLAIM

This application is a continuation of U.S. patent application Ser. No. 17/125,878, filed Dec. 17, 2020, which claims the benefit of priority under 35 U.S.C. § 119(e) of U.S. Provisional Patent Application Ser. No. 62/951,904, filed on Dec. 20, 2019, both of which are herein incorporated by reference in their entirety.

TECHNICAL FIELD

The present disclosure relates generally to a ceiling or general illumination flexible strip LED light assemblies with improved mechanical and electrical attachment.

BACKGROUND

Flexible circuit boards or tape systems are widely used to provide power and control to LED lighting systems. Such flexible circuit boards, often known as a LED light strips, can include multiple LEDs of the same or different color that can be mounted within light fixtures or on ceilings or walls of buildings. Some types of light strips can use permanent or detachable electrical connectors to connect additional light strip segments together.

One common method of connecting LED light strip segments together relies on overlapping edge positioned solder pads from two separate LED light strips and providing a solder joint that mechanically and electrically connects together the LED light strips. Unfortunately, such connected LED light strip segments can be fragile, with overlapping solder joins being susceptible to mechanical breakage when the LED light strips are subjected to twist or pull apart force.

SUMMARY

In one embodiment, a flexible light emitting diode (LED) support assembly includes a flexible circuit having a first layer, the first layer including a conductive material configured to connect to an LED die; a second layer, the second layer including an electrically insulating material; and a third layer positioned between the first and second layer, the third layer having a first terminal extended electrically connecting tab that extends outward beyond the first layer and the second layer. The LED assembly can further include the LED die electrically connected to the first layer. The second layer can include an adhesive material. The first terminal extended connecting tab can include exposed solder pads. The number of the exposed solder pads can be equal to a number of colors of LEDs in the LED die.

The LED assembly can further include a fourth layer including a second terminal extended connecting tab. The LED assembly can further include a fifth layer positioned between the first and second terminal extended connecting tabs, the fifth layer including electrically insulating material, and the second terminal extended connecting tab extending outward beyond the first, second, and fourth layers. The second terminal extended connecting tab can extend outward beyond the first layer, the second layer, and fourth layer in a direction opposite the first terminal extended connecting tab. The pads on the first terminal extended connecting tab can face a first direction and the pads on the second terminal extended connecting tab can face a second direction opposite the first direction.

The pads on the first terminal extended connecting tab are offset from the pads on the second terminal extended connecting tab (such that the pads on the different extended terminal connecting tabs are not superposed or so that the footprints of the pads only partially overlap). The LED assembly can include a second flexible circuit electrically and mechanically coupled to the first terminal extended electrically connecting tab using a conductive adhesive.

Pads on an end of the flexible circuit opposite the first terminal extended electrically connecting tab can be electrically connected to the first terminal extended electrically connecting tab. The LED assembly can further include power and control circuitry coupled to the flexible circuit, the power and control circuitry configured to provide power to the LED assembly and control color and brightness of light emitted by the LED die.

BRIEF DESCRIPTION OF THE DRAWINGS

FIG. 2B illustrates the LED light strip of FIG. 2A after the connecting tabs are situated proximate each other, such as for soldering the pads.

FIG. 3B illustrates the LED light strip of FIG. 3A after the connecting tabs are situated proximate each other, such as for soldering the pads together.

DETAILED DESCRIPTION

Figure 1:
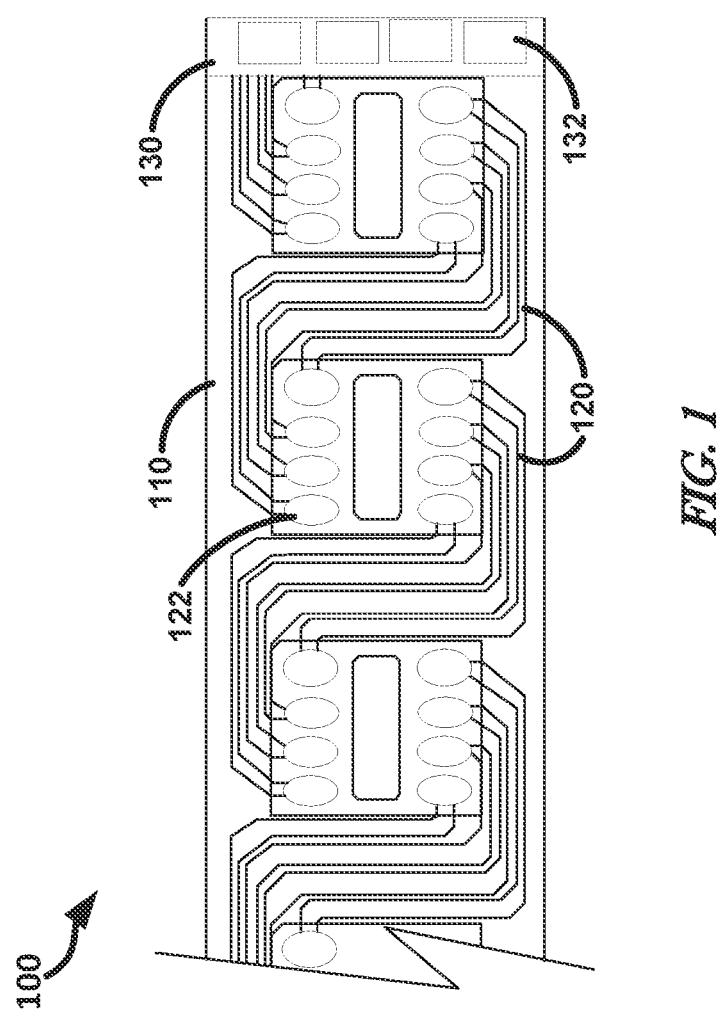
FIG. 1 illustrates is a top "X-ray" view of a portion of a light emitting diode (LED) light strip system.

FIG. 1 illustrates is a top "X-ray" view of a portion of a light emitting diode (LED) light strip system 100. The system 100 includes a connecting tab 130 with solder pads 132. The solder pads 132 can be electrically connected to solder pads 132 of another flexible printed circuit board (PCB).

A flexible printed circuit board (PCB) 110 can have multiple layers. One or more of the layers of the flexible PCB 110 can include mechanical support or electrical insulation for electrical elements. In some embodiments a layer of the PCB 110 can include an adhesive to mechanically couple layers to each other. The electrical elements can include an etched circuit trace 120, a ground plane, pads 122, or the like.

Circuit traces 120 can provide electrical connection to LED die pads 122 for power and control. In the illustrated embodiment, the terminal connecting tab 130 is not formed from a top or bottom layer of the flexible printed circuit board 110 but is instead formed from an intermediate layer (a layer between a top layer and a bottom layer). The extending intermediate layer extends outside a footprint defining a perimeter of the top and bottom layers. The extending intermediate layer forming the terminal connecting tab 130 can be used to provide an electrical connection to another flexible PCB or other electrical circuit element. In some embodiments, the flexible PCB 110 can be connected to itself to form a circular or other shaped light strip. The extending connecting tab 130 can be electrically connected to a mating set of solder pads that are recessed in an opposite end of the flexible PCB 110.

In addition to LEDs, the flexible printed circuit board 110 can support passive electronic components such as resistors or capacitors, and active electronic components such as LED driver components (e.g., amplifiers, transistors, or the like). The LEDs can be individually set, grouped, or set into an array. The LEDs can emit light of a single color or can emit multiple colors. The flexible PCB 110 can be serially, in parallel, or separately connected to a power and LED control unit (see FIG. 9).

The flexible PCB 110 can be laminated onto frames for mechanical support and cooling. In one embodiment, the frame can be a circular metal frame cut from a stainless steel or aluminum cylinder. Other shapes are also possible, including rectangular, ovoid, or irregular. In some embodiments a solid frame is not required, with separated studs or attachment points being used to hold the flexible PCB 110. Typically, a height of the frame should be at least as wide as the flexible PCB 110. The frame can also be used to elevate the flexible PCB 110 to a suitable height that is determined by the optical design. The frame can have mechanical features that allow quick and easy rigid attachment to a baseplate, including but not limited to spring latches, clips, or screw threaded attachment points.

Figure 2A:
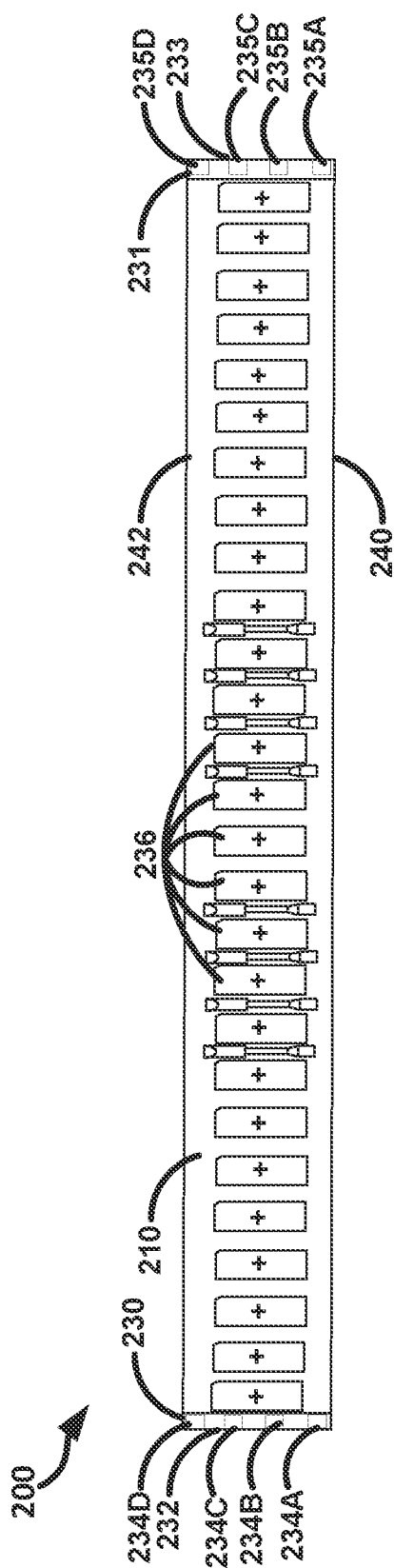
FIG. 2A illustrates a top view of a four color (e.g., red (R), green (G), blue (B), and white (W) (RGBW), or other color) LED light strip.

FIG. 2A illustrates a top view of a four color (e.g., red (R), green (G), blue (B), and white (W) (RGBW), or other color) LED light strip 200. The LED light strip 200 includes a flexible PCB 210 with connecting tabs 230, 231 positioned at opposing ends 232, 233, respectively. The top side includes attached LEDs 236. LEDs of a first color can be electrically coupled to a first pad 234A of the connecting tab 230 and a first pad 235A of the connecting tab 231, LEDs of a second color can be electrically coupled to a second pad 234B of the connecting tab 231 and a second pad 235B of the connecting tab 231, and so on. Such a configuration allows for power to be provided to all LEDs of a specific color simultaneously. In some embodiments, the connecting tabs 230, 231 are formed under a topmost layer of the flexible PCB 210. In some embodiments, the connecting tabs 230, 231 include a proper subset of the layers of the remainder of the flexible PCB 200. In some embodiments, the pads 234A, 235A are electrically coupled to LEDs of a first color, the pads 234B, 235B are electrically coupled to LEDs of a second color, the pads 234C, 235C are electrically coupled to LEDs of a third color, and the pads 234D, 235D are electrically coupled to LEDs of a fourth color. This is sometimes called a "symmetric" configuration. In the symmetric configuration, the pads most proximate to the side 240 (the pads 234A, 235A) are electrically coupled to a same color LED, the pads directly adjacent to the pads most proximate to the side 240 are coupled to a same color LED, and so on until an opposing side 242 is reached.

Figure 3A:
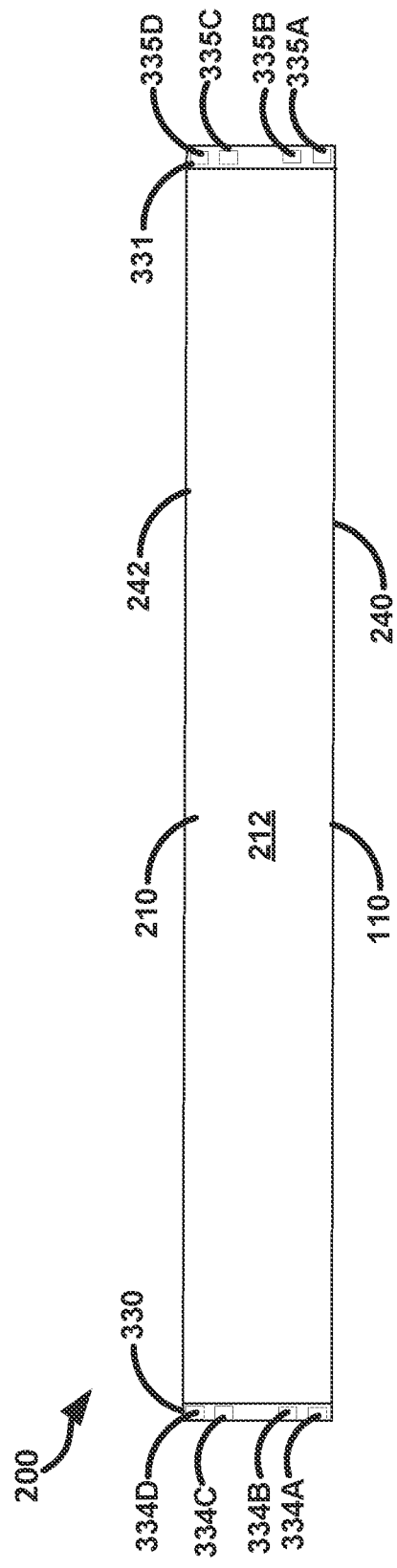
FIG. 3A illustrates a bottom view of the LED light strip.

FIG. 3A illustrates a bottom view of the LED light strip 200. FIG. 3A illustrates a bottom side opposing the top side in the view of FIG. 2. The bottom side of the LED light strip 200 can include a protective support or adhesive layer 212. The LED light strip 200 further includes additional connecting tabs 330, 331. The connecting tab 330 includes pads 334A, 334B, 334C, 334D. The connecting tab 331 includes pads 335A, 335B, 335C, 335D. The pads 334A, 335A can be electrically coupled to LEDs of a first color, the pads 334B, 335B can be electrically coupled to LEDs of a second color, the pads 334C, 335C can be electrically coupled to LEDs of a third color, and the pads 334D, 335D can be electrically coupled to LEDs of a fourth color.

The pads 334A, 334B, 334C, 334D can be staggered from the pads 234A, 234B, 234C, 234D, such that a footprint of the pads 234A, 234B, 234C, 234D does not completely overlap the footprint of the pads 334A, 334B, 334C, 334D. The pads 335A, 335B, 335C, 335D can be staggered from the pads 235A, 235B, 235C, 235D, such that a footprint of the pads 235A, 235B, 235C, 235D does not completely overlap the footprint of the pads 335A, 335B, 335C, 335D. Such a staggering can help reduce electrical interference or cross-talk between electrical signals.

The pads 334A, 335A can be electrically coupled LEDs of a different color than the pads 234A, 235A. In some embodiments, the pads 334A, 335A are electrically coupled to the same LEDs as the pads 234D, 235D. The pads 334B, 335B can be electrically coupled LEDs of a different color than the pads 234B, 235B. In some embodiments, the pads 334B, 335B are electrically coupled to the same LEDs as the pads 234C, 235C. The pads 334C, 335C can be electrically coupled LEDs of a different color than the pads 234C, 235C. In some embodiments, the pads 334C, 335C are electrically coupled to the same LEDs as the pads 234B, 235B. The pads 334D, 335D can be electrically coupled LEDs of a different color than the pads 234D, 235D. In some embodiments, the pads 334D, 335D are electrically coupled to the same LEDs as the pads 234A, 235A.

For the LED light strip 200, and similar to the embodiment discussed with respect to FIG. 1, circuit traces can provide electrical connection to LEDs 236, which can be LED dies, such as for power and control. In the illustrated embodiment, the terminal connecting tabs 230, 231, 330, 331 are not formed from a top or bottom layer of the flexible PCB 210 but are instead formed from one or more intermediate layers that extend beyond the rest of the flexible PCB layers. The extending intermediate layer forming the terminal connecting tab 230, 231, 330, 331 can be used to provide a solder interconnection with another flexible PCB. In some embodiments, the flexible PCB 210 can be connected to itself to form a circular or other shaped light strip.

Figure 4:
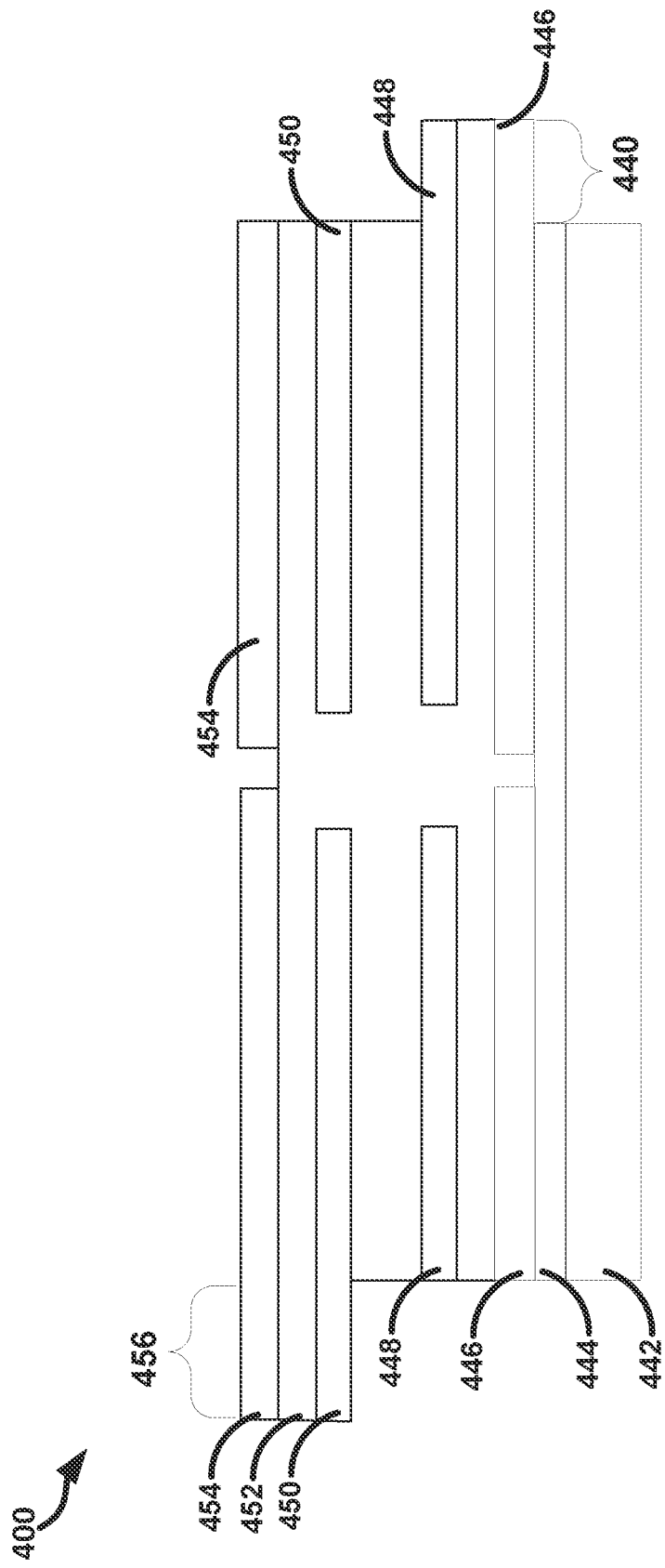
FIGS. 4 and 5 illustrate alternative cross sections of LED light strips.
Figure 5:
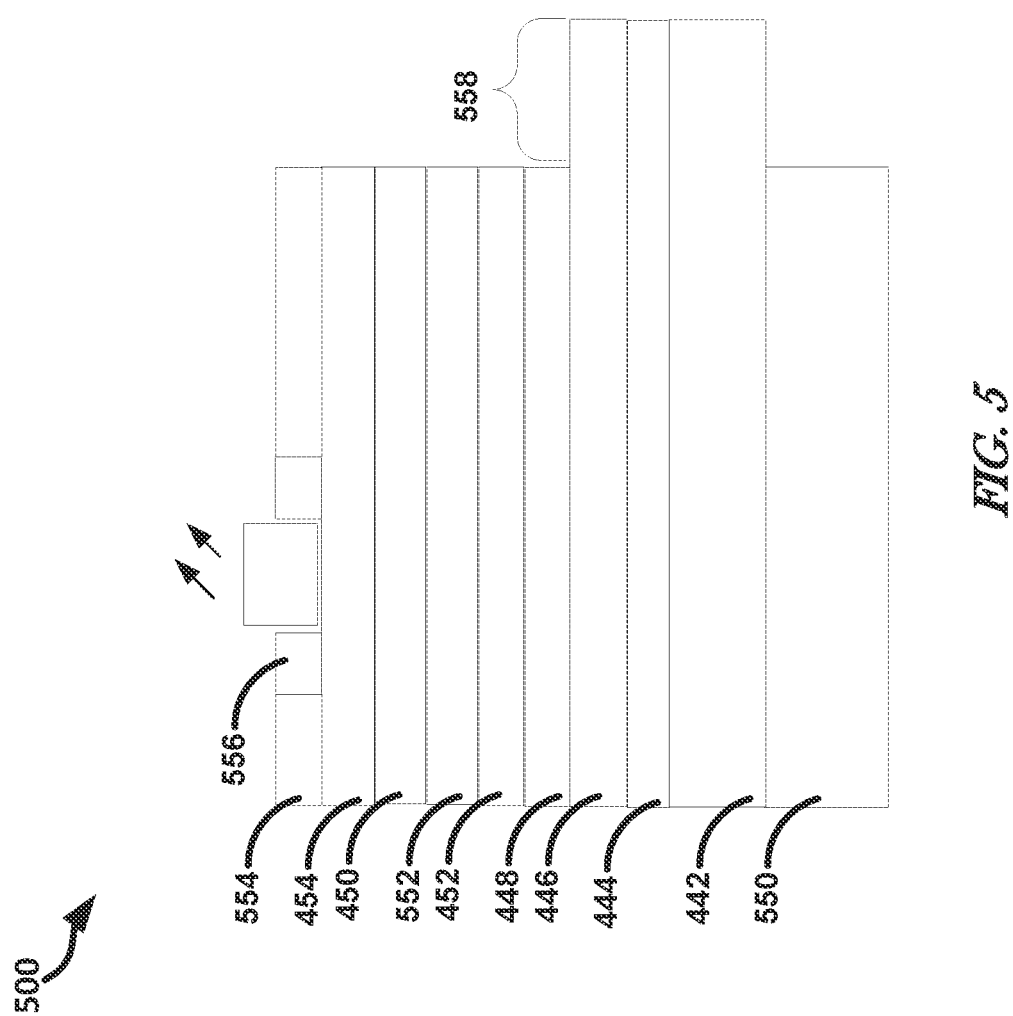

FIG. 2B illustrates the LED light strip 200 of FIG. 2A after the connecting tabs 230, 231 are situated proximate each other, such as for soldering the pads 234A, 234B, 234C, 234D to the pads 235A, 235B, 235C, 235D, respectively. FIG. 3B illustrates the LED light strip 200 of FIG. 3A after the connecting tabs 330, 331 are situated proximate each other, such as for soldering the pads 334A, 334B, 334C, 334D to the pads 335A, 335B, 335C, 335D, respectively FIGS. 4 and 5 illustrate alternative cross sections of LED light strips 400 and 500. The LED light strip 400 includes a pressure sensitive adhesive (PSA) 442. A solder mask 444 is situated on the PSA 442. Conductive material 446 is situated on the solder mask 444. The solder mask 444 can be a liquid photo-imageable (LPI) material, silicone, or the like. The conductive material 446 can include copper, silver, gold, aluminum, stainless steel, an alloy thereof, or the like. A base material 448 can be situated between conductive layers 454 and 446. An adhesive layer 452 can bond the conductive layer 454, 446 the base material 448, 450, and the solder mask 444. The base material 448, 450, can include a polyimide (PI), another polymer, FR-4, prepreg, a combination thereof, or the like. The conductive material 454, base material 450, and adhesive 452 can extend, in a first direction, beyond material situated below the based material 450 to form a connecting tab 456. The conductive material 446, adhesive 452, and base material 448 can extend, in a second direction opposite the first direction, beyond material situated above the base material 448 to form the connecting tab 446. Electrical pads can be formed on the connecting tab 446 or 456, such as to provide electrical connectivity to the conductive material 446, 456, respectively.

The LED light strip 500 includes a pressure sensitive adhesive (PSA) 442 on a liner 550. The liner 550 can include paper, plastic, or a combination thereof. The liner 550 can be disposable. The liner 550 can include a Poly-Coated Craft (PCK) material. A solder mask 444 is situated on the PSA 442. Conductive material 446 is situated on the solder mask 444. A base material 448 can be situated between conductive layers 454 and 446. An adhesive layer 452 can bond a conductive layer 552 and the base material 448. Another base material 450 can be situated on the conductive material 552. The conductive material 454 can be situated on the base material 450. A solder mask 554, 556 can be situated on the conductive material 454. The conductive material 446, solder mask 444, and PSA 442 can extend beyond material situated above the conductive material 446 and below the PSA 442 to form the connecting tab 558.

As illustrated in both FIGS. 4 and 5, the LED light strips 400 and 500 are formed from multiple insulating and copper layers, with at least one layer forming the terminal connecting tab 446, 456, or 558.

Figure 6:
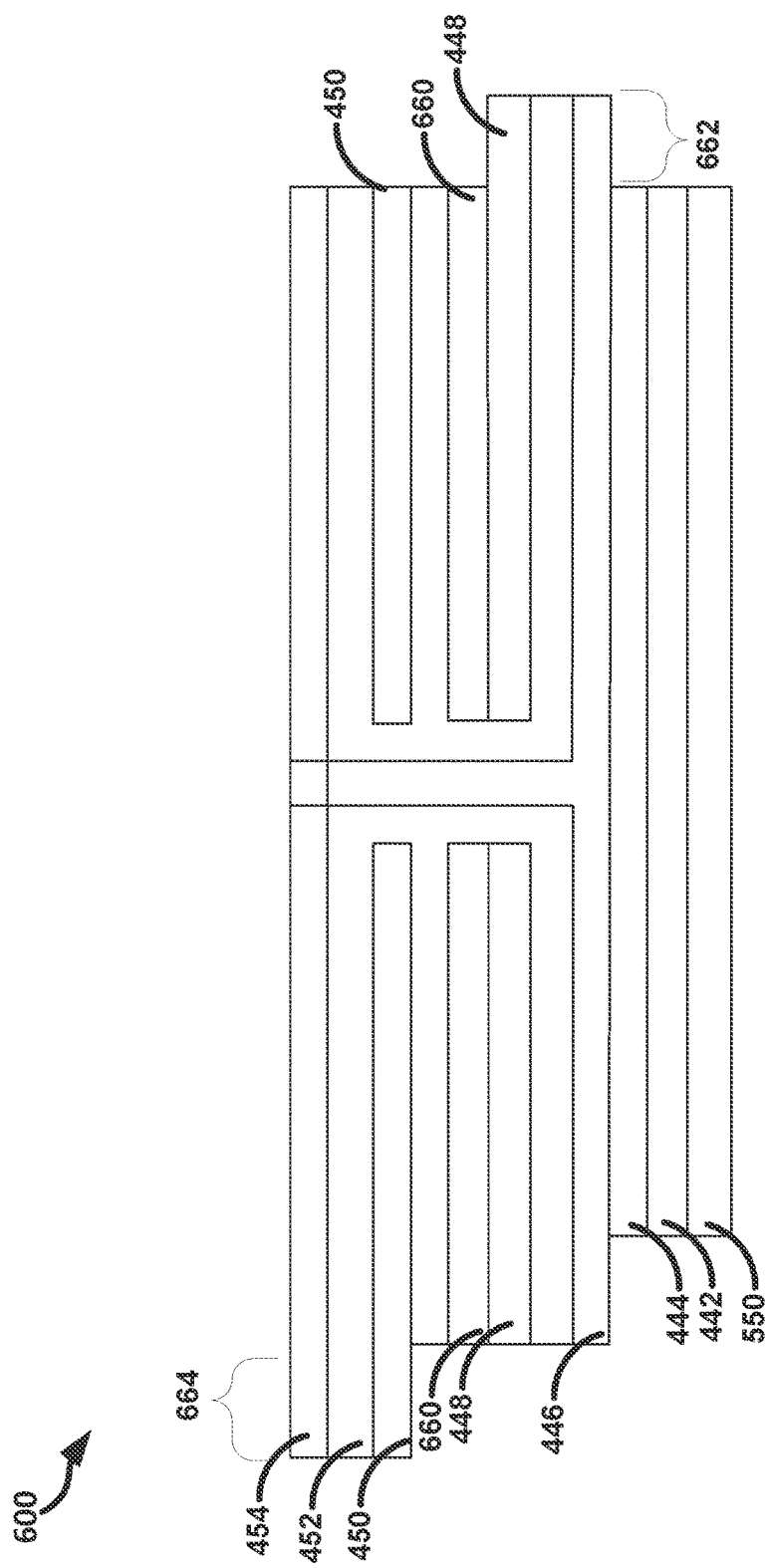
FIG. 6 illustrates in cross section an alternative of an LED light strip.

FIG. 6 illustrates in cross section an alternative of an LED light strip 600. In this embodiment based on two level soldering process and design, bottom solder pads (electrodes) are shifted compared to top solder pads so as not to be superposed vertically, minimizing shorting risk. Solder pads correspond to exposed portion of conductive material 666, 676. The LED light strip 600 is similar to the LED light strip 400 with a liner 550 below the PSA 442 and a conductive material 660 between the base 448 and the adhesive 452. The liner 550 can include a paper material, plastic material, or a combination thereof. Poly-Coated Kraft is an example of a disposable liner material. The LED strip 600 includes connecting tabs 662, 664 extending in different directions therefrom.

Figure 7:
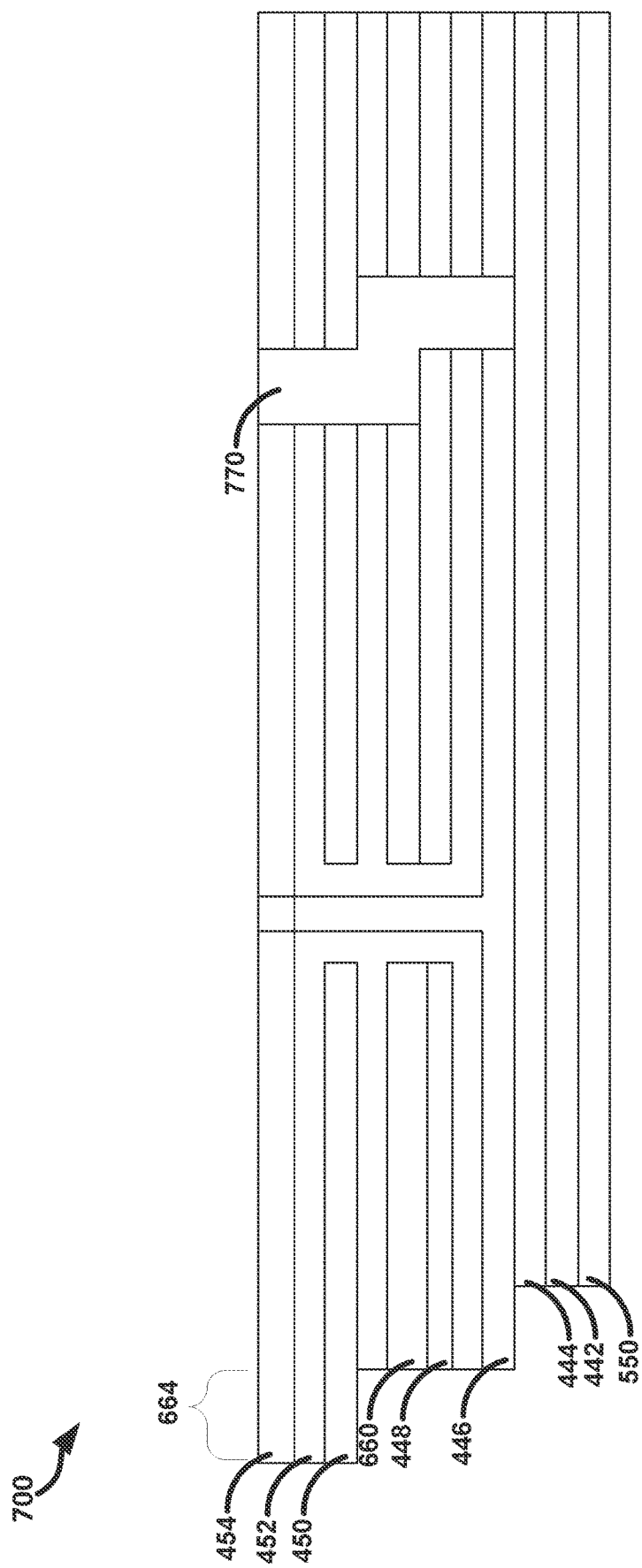
FIG. 7 illustrates in cross-section an alternative of an LED light strip.

FIG. 7 illustrates in cross-section an alternative of an LED light strip 700. The LED light strip 600 is similar to the LED light strip 600 without the connecting tab 662 and including a via 770 connecting conductive material 446 and 454. To cover the solder pads on or formed in the conductive material 446, 454, the bottom PSA 550 can be applied after soldering on the conductive material 446 is completed. A tape tab, such as a Kapton® tab, can also be included at these locations prior to PSA 550 integration, such as to reinforce the dielectric strength.

Figure 8:
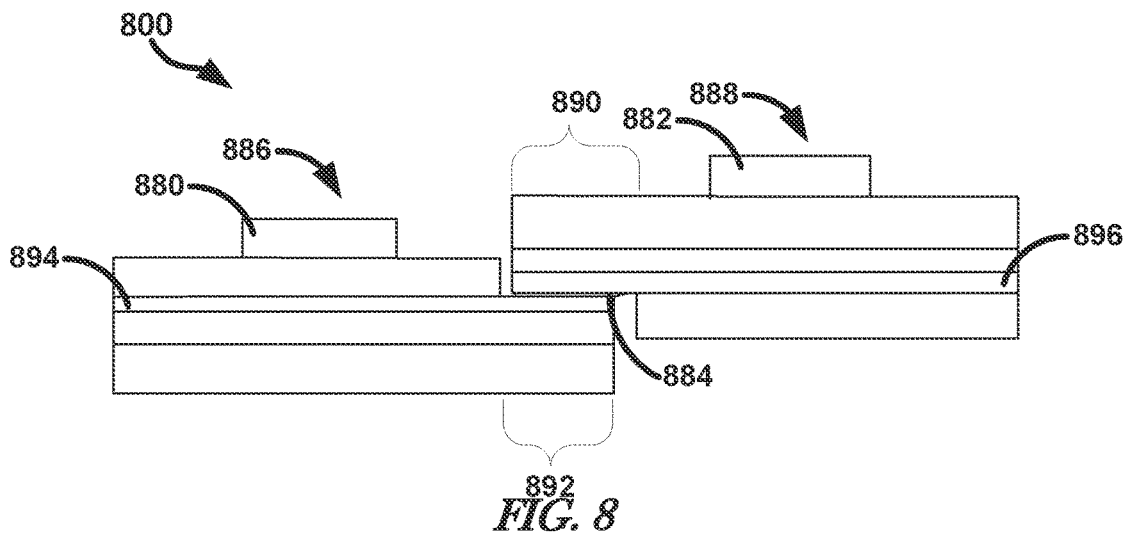
FIG. 8 illustrates a cross-section view of two ends of one or more LED light strips being electrically connected at connecting tabs thereof.

FIG. 8 illustrates a cross-section view of two ends of one or more LED light strips 886, 888 being electrically connected at connecting tabs 890, 892 thereof. The LED light strips 886, 888 include LED dies 880, 882 thereon. The LED dies 880, 882 can include LEDs of multiple colors thereon. The colors can include one or more of R, G, B, W, among others. Solder 884, or other electrical adhesive, can be situated on one or more of the connecting tabs 890, 892. The connecting tabs 890, 892 can be pressed together such that the solder 884 mechanically bonds and electrically connects electrical pads of the connecting tabs 890, 892. As seen with respect to FIG. 8, light strip 886 includes a copper layer 894 with an extending terminal connecting tab 890, 892 that can be joined to another end of a same or another LED light strip. Multiple extending tab connection is also possible, as seen with respect to FIG. 9.

Figure 9:
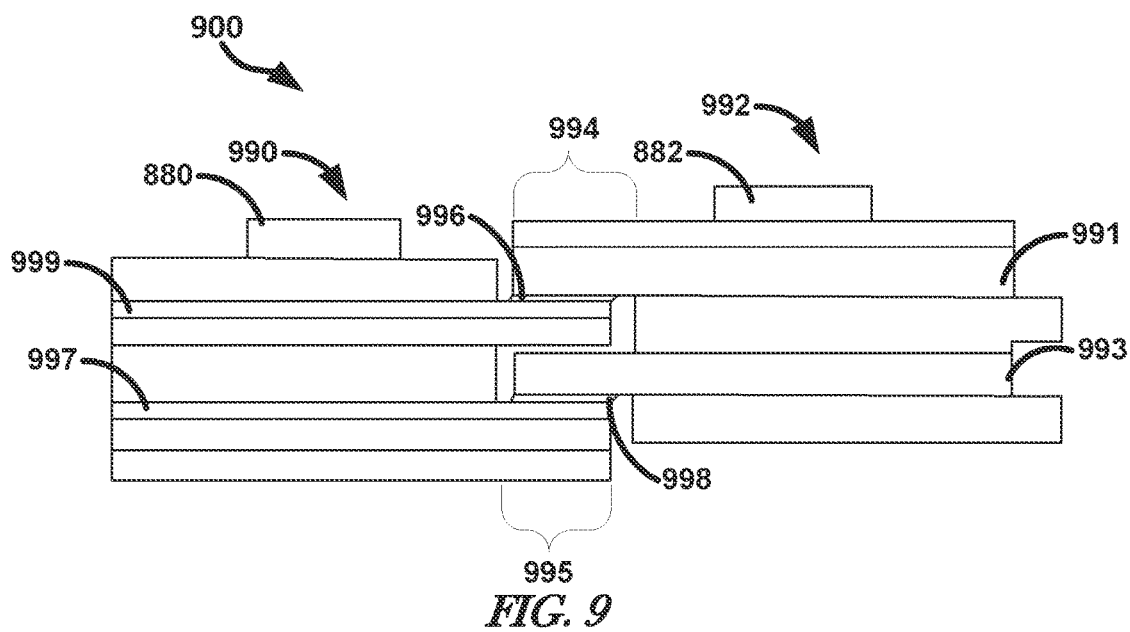
FIG. 9 illustrates a cross-section view of two ends of one or more LED light strips being electrically connected at connecting tabs (the inner connecting tabs are not labeled so as to not obscure the view) thereof.

FIG. 9 illustrates a cross-section view of two ends of one or more LED light strips 990, 992 being electrically connected at connecting tabs 994, 995 (the inner connecting tabs are not labeled so as to not obscure the view) thereof. The LED light strips 990, 992 include the LED dies 880, 882 thereon. Solder 996, 998 or other electrical adhesive, can be situated on one or more of the connecting tabs 994, 995. The connecting tabs 994, 995 can be pressed together such that the solder 996, 998 mechanically bonds and electrically connects electrical pads of the connecting tabs 994, 995. Multiple connecting tabs 994 of the LED light strip 992 can be electrically and mechanically coupled to mating multiple connecting tabs 995 of the LED light strip 990, simultaneously. As seen with respect to FIG. 9, the light strip 990 includes conductive material 997, 999 on corresponding extending terminal connecting tabs 995 that can be joined, respectively, to conductive material 993, 991 on extending terminal connecting tabs 994 of the same or another LED light strip.

Figure 10:
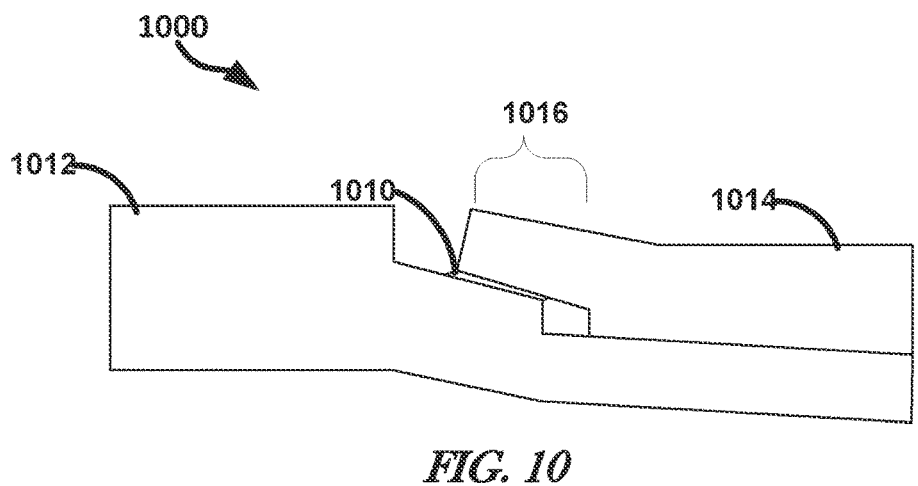
FIG. 10 illustrates a cross-section view of two ends of one or more LED light strips being electrically connected.

FIG. 10 illustrates a cross-section view of two ends of one or more LED light strips 1012, 1014 being electrically connected. Since the LED light strips 1012, 1014 are formed on the flexible PCB and include one or more connecting tabs 1016, the light strips 1012, 1014 can be pressed together with adhesive 1010 forming a bond between the light strips 1012, 1014. Support for conductive material can be provided by one or more base, adhesive, or other layers of the flexible PCB. Advantageously, electrically or mechanically coupling LED light strips by the connecting tabs can reduce mechanical or electrical breakage when the LED light strips are subjected to twist or pull apart force. This is compared to prior solutions that use wire bonds, or a solder bridge across solder pads to electrically and mechanically coupled the LED light strips.

Figure 11:
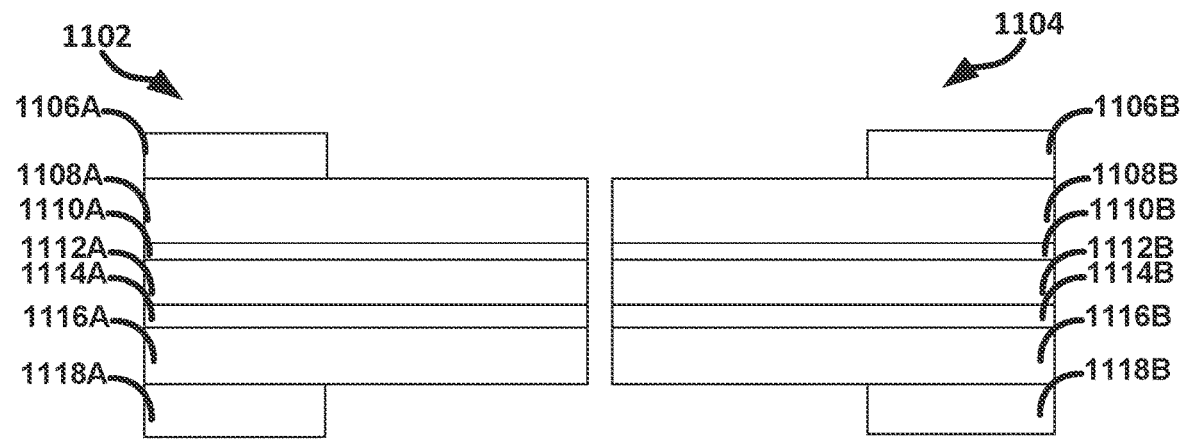
FIG. 11 illustrates a cross-section view of two ends of one or more LED light strips in close proximity, before electrical connection.

FIG. 11 illustrates a cross-section view of two ends 1102, 1104 of one or more LED light strips in close proximity, before electrical connection. The flexible printed circuit (FPC) end 1102 includes a material stack including a solder mask material 1118A, a conductive material 1104A on the solder mask material 1116A, a first adhesive 1114A bonding the conductive material 1116A and a dielectric material 1112A, a second adhesive 1110A bonding the dielectric material 1112A and a second conductive material 1108A, and a solder mask 1106A on the conductive material 1108A. The flexible printed circuit (FPC) end 1104 includes a same material stack including a solder mask material 1118B, a conductive material 1104B on the solder mask material 1116B, a first adhesive 1114B bonding the conductive material 1116B and a dielectric material 1112B, a second adhesive 1110B bonding the dielectric material 1112B and a second conductive material 1108B, and a solder mask 1106B on the conductive material 1108B. Conductive material 1220, 1222 (see FIG. 12) can be applied to electrically and mechanically connect the conductive material 1108A and 1108B, and 1116A and 1116B, respectively. Unfortunately, electrically and mechanically coupling such structures comes with a risk of shorting the conductive material 1108A and 1108B and 1116A and 1116B. This is illustrated in FG. 12.

Figure 12:
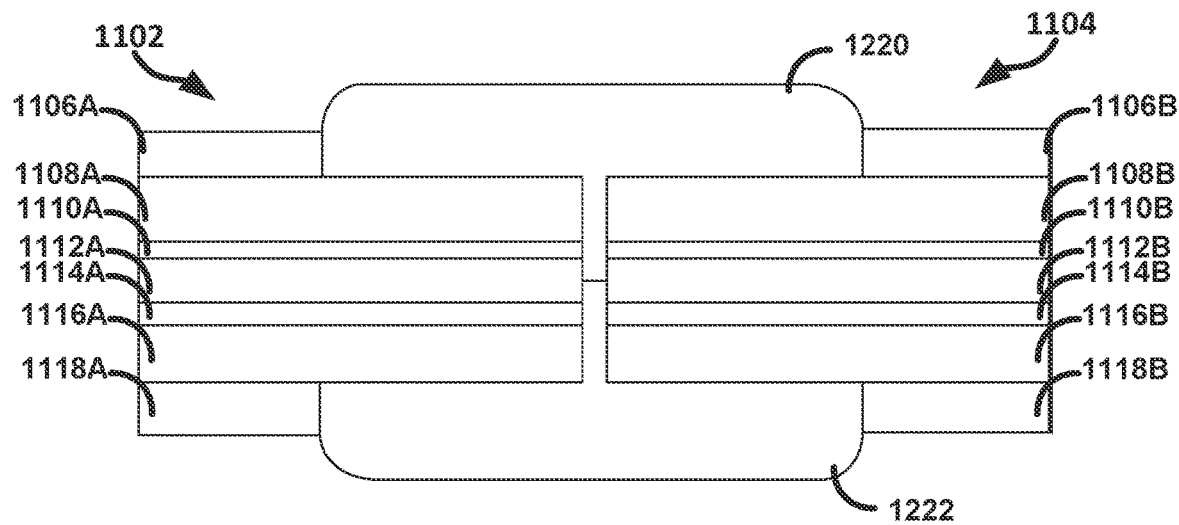
FIG. 12 illustrates a cross-section view of the two ends of the one or more LED light strips of FIG. 11 after electrical connection.

FIG. 12 illustrates a cross-section view of the two ends of the one or more LED light strips of FIG. 11 after electrical connection. Since the conductive material 1220 is stacked directly over the conductive material 1222, and over the ends, there is a risk that conductive material 1220, 1222 will bridge together, shorting the conductive material 1108A, 1108B, 1116A, and 1116B. The solder joints (conductive material 1220, 1222) can be staggered to help reduce the chances of the conductive material 1220, 1222 bridging. Many examples of such staggering are presented already and some more are presented regarding FIGS. 13, 14, and 15.

Figure 13:
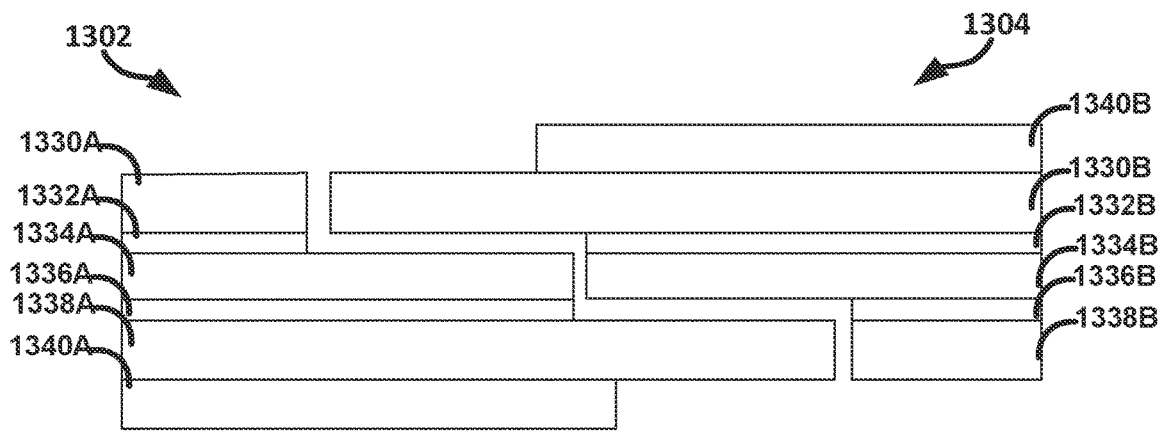
FIG. 13 illustrates a cross-section view of two ends of one or more LED light strips that, after electrical connection, include offset conductive joints.

FIG. 13 illustrates a cross-section view of two ends 1302, 1304 of one or more LED light strips that, before electrical connection, includes offset conductive pads (exposed conductive material 1330A and 1330B, and 1338A and 1338B). Instead of having exposed conductive material stacked directly over each other, as in FIGS. 11 and 12, the ends 1302, 1304 of one or more LED light strips include exposed conductive material offset vertically. This helps reduce the changes that the conductive material 1330A and 1330B does not bridge with conductive material 1338A and 1338B.

The FPC end 1302 includes a material stack including a solder mask material 1340A, a first conductive material 1338A on (in contact with) the solder mask material 1340A, a first adhesive 1336A bonding the conductive material 1338A and a dielectric material 1334A, and a second adhesive 1332A bonding the dielectric material 1334A and a second conductive material 1330A. The FPC end 1304 includes a material stack including a first conductive material 1338B, a first adhesive 1336B bonding the first conductive material 1338B and a dielectric material 1334B, a second adhesive 1332B bonding the dielectric material 1334B and a second conductive material 1330B, and a solder mask 1340B on (in contact with) the second conductive material 1330B.

Figure 14:
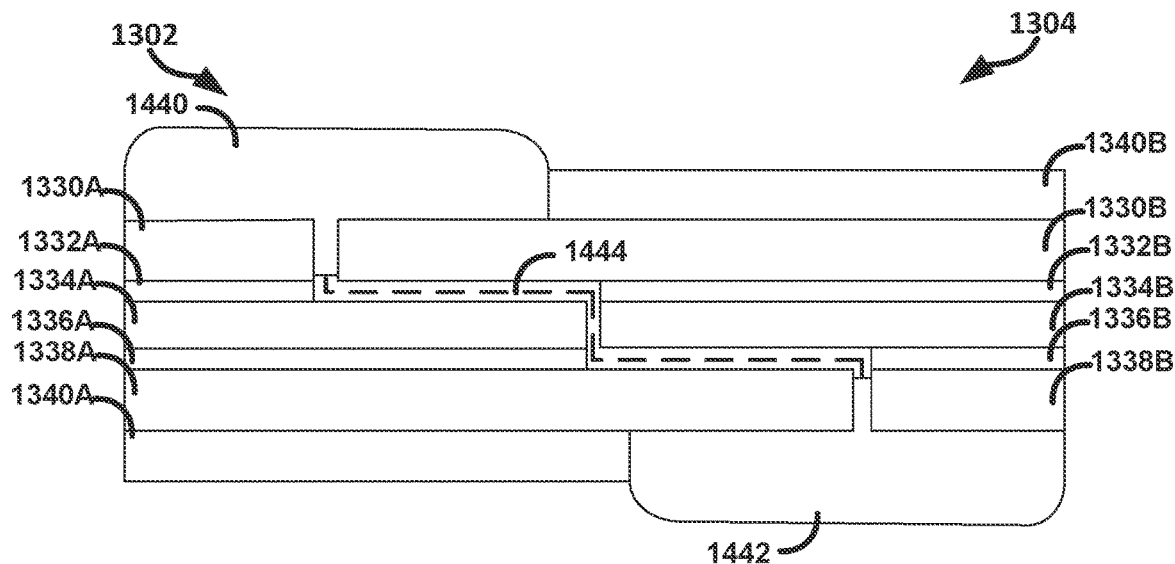
FIG. 14 illustrates an example of a cross-section view of the two ends of the one or more LED light strips of FIG. 13 after electrical connection.

FIG. 14 illustrates an example of a cross-section view of the two ends 1302, 1304 of the one or more LED light strips of FIG. 13 after electrical connection. The electrical connection includes a conductive joint 1440 that electrically and mechanically connects the second conductive material 1330A and 1330B. Another conductive joint 1442 is illustrated electrically and mechanically connecting the first conductive material 1338A and 1338B. Since the conductive joints 1440 and 1442 are offset vertically from each other, it is much more unlikely for them to electrically short to each other. This is because conductive material would need to flow along line 1444 between the first conductive material 1330A, 1330B and second conductive material 1338A, 1338B to short the conductive joints 1440 and 1442.

Figure 15:
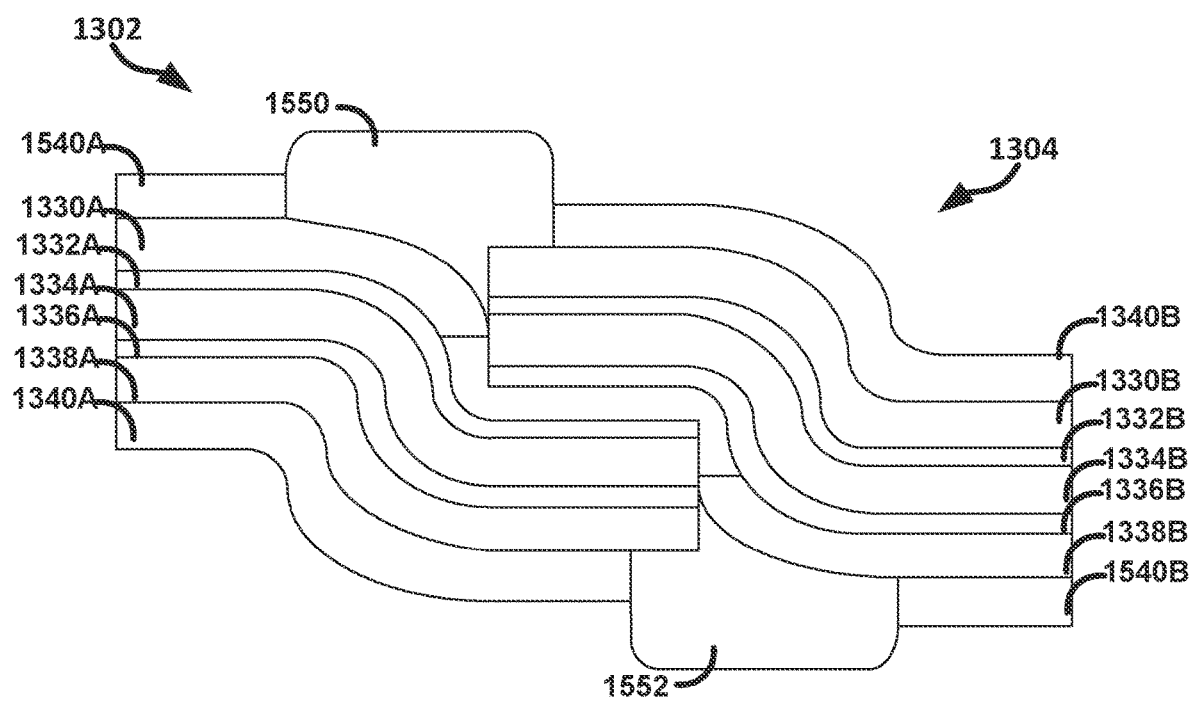
FIG. 15 illustrates another example of a cross-section view of the two ends of the one or more LED light strips of FIG. 13 after electrical connection.

FIG. 15 illustrates another example of a cross-section view of the two ends 1302, 1304 of the one or more LED light strips of FIG. 13 after electrical connection. FIG. 15 is similar to FIG. 14 with more of the ends 1302, 1304 illustrated including additional solder mask 1540A, 1540B in view and with the FPCs deformed before electrical and mechanical connection by solder joints 1550, 1552. Because the conductive joints 1550, 1552 are offset from each other vertically (not stacked directly over one another or in the shadow of each other) the ends 1302, 1304 can be bent and still be reliably electrically and mechanically connected without shorting the conductive joints 1550, 1552. In contrast, the ends 1102, 1104 (see FIGS. 11 and 12) are much more likely to short the conductive joints 1220, 1222 if the ends are bent before or during electrical and mechanical connecting. This is because the already space between the conductive material 1108A or 1108B and 1116A or 1116B is further reduced when one or more ends 1102, 1104 are bent or otherwise deformed.

Figure 16:
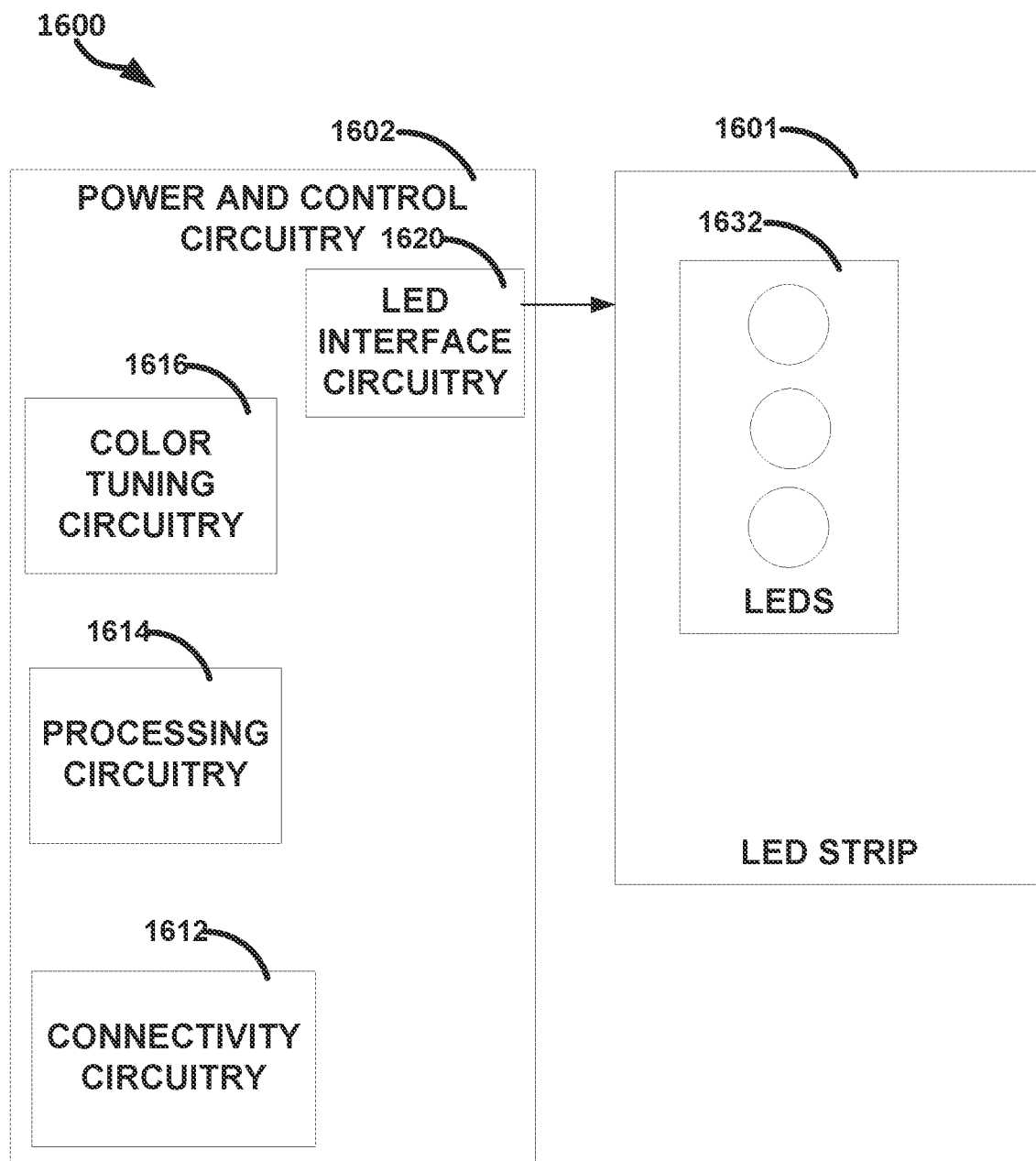
FIG. 16 illustrates a power and control circuitry system for controlling an LED light strip.

FIG. 16 illustrates a power and control circuitry system 1600 for controlling an LED light strip, such as described herein. As seen in FIG. 16, the system 1600 includes a power and control circuitry 1602 that includes connectivity circuitry 1612 and processing circuitry 1614. The connectivity circuitry 1612 can include wireless or wired connection for user or automatic control via the processing circuitry 1614. In some embodiments, smart phones with lighting apps installed can be used to provide lighting control and determine lighting status (e.g., LEDs on or off). The processing circuitry 1614 can control a color tuning circuitry 1616. The color tuning circuitry 1616 is able to change or adjust LED color, temperature, intensity, or the like produced by the LED light strip 1601. Control and power is provided to LED die 1632 via LED interface circuitry 1620. The control circuitry 1602 can manage correlated color temperature (CCT) tuning. A user can change the tint of light along an iso-CCT line desired.

The power and LED control circuitry 1602 includes electrical or electronic circuitry to enable the operation of the LEDs of the LED light strip 1601. Furthermore, the LED circuit boards of the LED light strip 1601 can include circuitry configured to manage individual or grouped operation of the plurality LEDs in LED light strip 1601. In some embodiments, each LED can be separately controlled by the power and control circuitry 1602, while in other embodiments groups of LEDs can be controlled as a block. In still other embodiments, both single LEDs and groups of LEDs can be controlled. In one embodiment, intensity can be separately controlled and adjusted by setting appropriate ramp times and pulse width for each LED. This allows staging of LED activation to reduce power fluctuations, and to provide superior luminous intensity control.

The LEDs discussed in this disclosure can include but are not limited to LEDs formed of sapphire or silicon carbide. The LEDs can be formed from an epitaxially grown or deposited semiconductor n-layer. A semiconductor p-layer can then be sequentially grown or deposited on the n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. In certain embodiment, laser light emitting elements can be used.

Color of emitted light from the LEDs can be modified using a phosphor contained in glass, or as a pre-formed sintered ceramic phosphor, which can include one or more wavelength converting materials able to create white light or monochromatic light of other colors. All or only a portion of the light emitted by the LEDs may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors.

Direction of light emitted from each LED can be modified by one or more optics. Optic can be a single optical element or a multiple optic elements. Optical elements can include converging or diverging lenses, aspherical lens, Fresnel lens, or graded index lens, for example. Other optical elements such as mirrors, beam diffusers, filters, masks, apertures, collimators, or light waveguides are also included. Optics can be positioned at a distance from the LED elements in order to receive and redirect light from multiple LEDs. Alternatively, optics can be set adjacent to each LED element to guide, focus, or defocus emitted light. In some embodiments, optics are connected to actuators for movement. In some embodiments, actuator movement can be programmed. This allows, for example, a lens to be moved to increase or decrease beam size.

Many modifications and other embodiments will come to the mind of one skilled in the art having the benefit of the teachings presented in the foregoing descriptions and the associated drawings. Therefore, it is understood that embodiments are not to be limited to the specific embodiments disclosed, and that modifications and embodiments are intended to be included within the scope of the appended claims. It is also understood that other embodiments may be practiced in the absence of an element/step not specifically disclosed herein.

The invention claimed is:

1. A flexible light emitting diode (LED) support assembly comprising:
   an LED die;
   a flexible circuit including:
      a first layer, the first layer including a conductive material electrically connected to the LED die;
      a second layer, the second layer including an electrically insulating material;
      a third layer positioned between the first and second layer, the third layer having a first terminal extended connecting tab that extends outward beyond the first layer and the second layer;
      a fourth layer including a second terminal extended connecting tab; and
      a fifth layer positioned between the first and second terminal extended connecting tabs, the fifth layer including electrically insulating material, and the second terminal extended connecting tab extending outward beyond the first, second, and fifth layers.

2. The LED assembly of claim 1, further comprising the LED die electrically connected to the first layer.

3. The LED assembly of claim 1, wherein the second layer includes an adhesive material.

4. The LED assembly of claim 1, wherein the first terminal extended connecting tab includes exposed solder pads.

5. The LED assembly of claim 4, wherein a number of the exposed solder pads is equal to a number of colors of LEDs in the LED die.

6. The LED assembly of claim 1, wherein the second terminal extended connecting tab extends outward beyond the third layer.

7. The LED assembly of claim 1, wherein the second terminal extended connecting tab extends outward beyond the first layer, the second layer, and fifth layer in a direction opposite the first terminal extended connecting tab.

8. The LED of claim 7, wherein the pads on the first terminal extended connecting tab face a first direction and the pads on the second terminal extended connecting tab face a second direction opposite the first direction.

9. The LED assembly of claim 8, wherein the pads on the first terminal extended connecting tab are offset from the pads on the second terminal extended connecting tab.

10. The LED assembly of claim 1, further comprising a second flexible circuit electrically and mechanically coupled to the first terminal extended connecting tab using a conductive adhesive.

11. The LED assembly of claim 1, wherein pads on an end of the flexible circuit opposite the first terminal extended electrically connecting tab are electrically connected to the first terminal extended connecting tab.

12. The LED assembly of claim 1, further comprising power and control circuitry coupled to the flexible circuit, the power and control circuitry configured to provide power to the LED assembly and control color and brightness of light emitted by the LED die.

13. A flexible lighting apparatus comprising:
   a first layer, the first layer including a conductive material configured to connect to an LED die;
   a second layer, the second layer including an electrically insulating material;
   a third layer positioned between the first and second layer, the third layer having a first terminal extended electrically connecting tab that extends outward beyond the first layer and the second layer;
   a fourth layer including a second terminal extended connecting tab; and
   a fifth layer positioned between the first and second terminal extended connecting tabs, the fifth layer including electrically insulating material, and the second terminal extended connecting tab extending outward beyond the first, second, and fourth layers.

14. The flexible lighting apparatus of claim 13, further comprising the LED die electrically connected to the first layer.

15. The flexible lighting apparatus of claim 13, wherein the second layer includes an adhesive material.

16. The flexible lighting apparatus of claim 13, wherein the first terminal extended electrically connecting tab including exposed solder pads.

17. The flexible lighting apparatus of claim 16, wherein a number of the exposed solder pads equal to a number of colors of LEDs in the LED die.

18. The flexible lighting apparatus of claim 13, wherein the second terminal extended connecting tab extends outward beyond the third layer.

19. The flexible lighting apparatus of claim 18, wherein the second terminal extended connecting tab extends outward beyond the first layer, the second layer, and fourth layer in a direction opposite the first terminal extended connected tab.

20. The flexible lighting apparatus of claim 19, wherein pads on the second terminal extended connecting tab face a direction opposite pads on the first terminal extended connecting tab.

* * * * *

UNITED STATES PATENT AND TRADEMARK OFFICE
CERTIFICATE OF CORRECTION

PATENT NO. : 11,639,788 B2  
APPLICATION NO. : 17/872335  
DATED : May 2, 2023  
INVENTOR(S) : Diana et al.

Page 1 of 1

It is certified that error appears in the above-identified patent and that said Letters Patent is hereby corrected as shown below:

In the Claims

In Column 10, Line 3, in Claim 8, after "LED", insert --assembly--

Signed and Sealed this  
Fourth Day of July, 2023

Katherine Kelly Vidal  
*Director of the United States Patent and Trademark Office*